(12) United States Patent
Tian et al.

(10) Patent No.: US 11,631,635 B2
(45) Date of Patent: Apr. 18, 2023

(54) FLEX PREVENTION MECHANICAL STRUCTURE SUCH AS A RING FOR LARGE INTEGRATED CIRCUIT MODULES AND PACKAGES AND METHODS OF MANUFACTURE USING SAME

(71) Applicant: International Business Machines Corporation, Armonk, NY (US)

(72) Inventors: Shurong Tian, Mount Kisco, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/737,999

(22) Filed: Jan. 9, 2020

(65) Prior Publication Data

US 2021/0217690 A1 Jul. 15, 2021

(51) Int. Cl.
*H01L 23/00* (2006.01)
*H01L 23/498* (2006.01)

(52) U.S. Cl.
CPC ...... *H01L 23/49816* (2013.01); *H01L 23/562* (2013.01); *H01L 24/13* (2013.01)

(58) Field of Classification Search
CPC ....... H05K 1/0271; H05K 2201/10553; H05K 2201/2009; H05K 2201/09136; H05K 2201/10568; H01L 23/16; H01L 23/585; H01L 2924/3511; H01L 2224/27009; H01L 23/49816; H01L 24/13; H01L 23/562–576; H01L 23/18; H01L 23/24
See application file for complete search history.

(56) References Cited

U.S. PATENT DOCUMENTS

| | | | | |
|---|---|---|---|---|
| 4,847,146 A | * | 7/1989 | Yeh | B32B 7/02 428/332 |
| 5,633,535 A | * | 5/1997 | Chao | H05K 3/3436 257/778 |
| 5,949,137 A | | 9/1999 | Domadia et al. | |
| 6,528,892 B2 | | 3/2003 | Caletka et al. | |
| 8,334,582 B2 | | 12/2012 | Jeng et al. | |
| 8,986,806 B1 | | 3/2015 | Baloglu et al. | |
| 9,089,052 B2 | | 7/2015 | Li et al. | |
| 9,373,590 B1 | * | 6/2016 | Interrante | H01L 23/562 |
| 2003/0003624 A1 | * | 1/2003 | Farooq | H01L 24/11 438/108 |
| 2005/0077080 A1 | * | 4/2005 | Dairo | H05K 7/1061 174/255 |
| 2007/0158841 A1 | * | 7/2007 | Lo | H01L 23/3128 257/737 |

(Continued)

*Primary Examiner* — Bradley Smith
*Assistant Examiner* — William Henry Anderson
(74) *Attorney, Agent, or Firm* — Harrington & Smith

(57) ABSTRACT

A method includes attaching an integrated circuit chip module substrate to a printed circuit board (PCB). First region(s) of a bottom surface of the module include electrical contacts to the board, and second region(s) of the bottom surface of the module lack such contacts. Mechanical structures are assembled into the second regions. These structures allow lateral motion of the module relative to the board, and are sized and placed to inhibit bending of the second regions of the module towards the board under application of a vertical force on a top surface of the module. A package for an integrated circuit may be assembled using the method.

17 Claims, 10 Drawing Sheets

(56) References Cited

U.S. PATENT DOCUMENTS

| | | | |
|---|---|---|---|
| 2009/0314536 A1* | 12/2009 | Takizawa | H05K 3/305 |
| | | | 257/690 |
| 2011/0084375 A1* | 4/2011 | Eu | H05K 1/141 |
| | | | 257/E23.068 |
| 2012/0188721 A1 | 7/2012 | Ho et al. | |
| 2014/0048326 A1 | 2/2014 | Lin et al. | |
| 2015/0008571 A1* | 1/2015 | Gallegos | H01L 24/83 |
| | | | 257/690 |
| 2016/0086900 A1* | 3/2016 | Chen | H01L 23/49816 |
| | | | 438/462 |
| 2016/0095209 A1 | 3/2016 | Starkston et al. | |
| 2016/0172313 A1 | 6/2016 | Zhu | |
| 2016/0172323 A1 | 6/2016 | Tomita et al. | |
| 2017/0372990 A1* | 12/2017 | Tani | H01L 23/12 |

\* cited by examiner

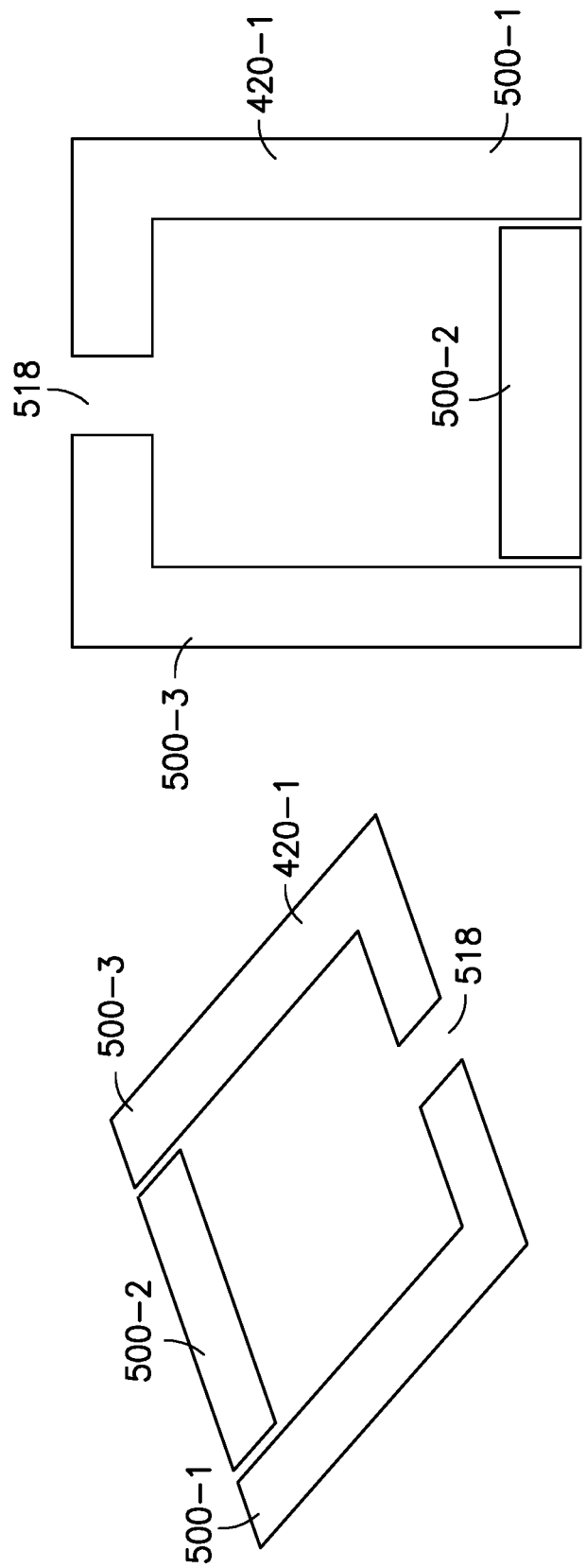

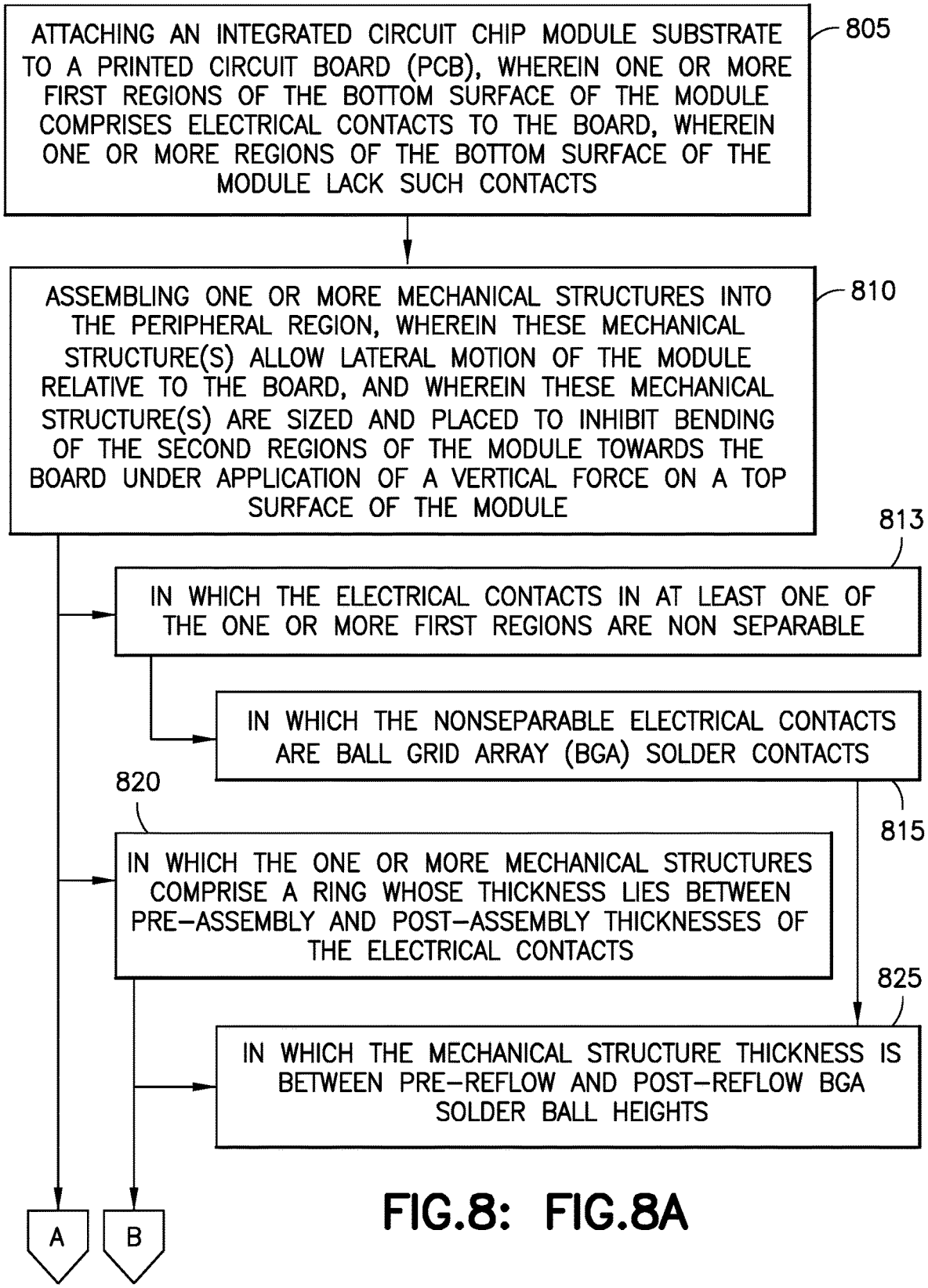
FIG.8: FIG.8A

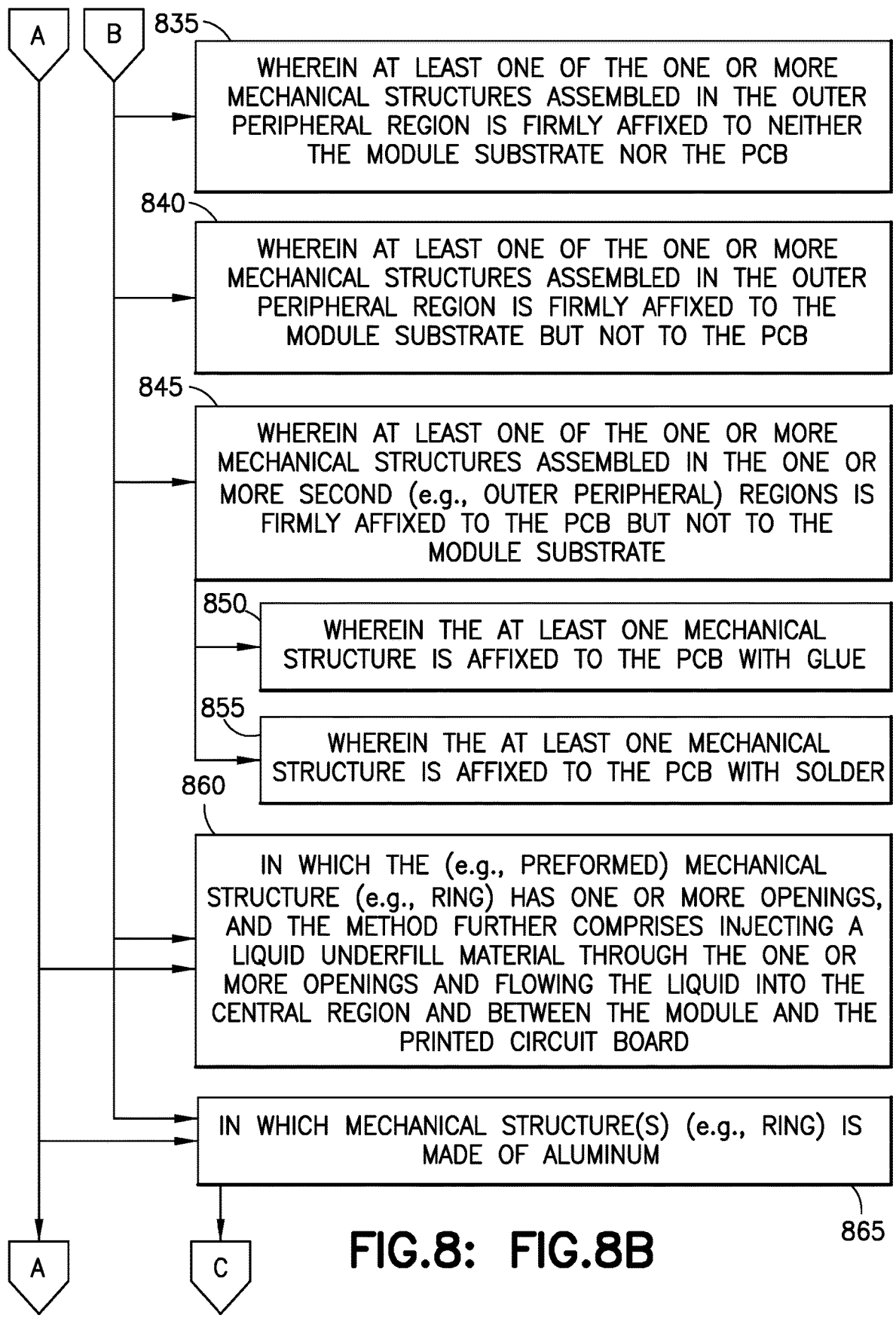
FIG.8: FIG.8B

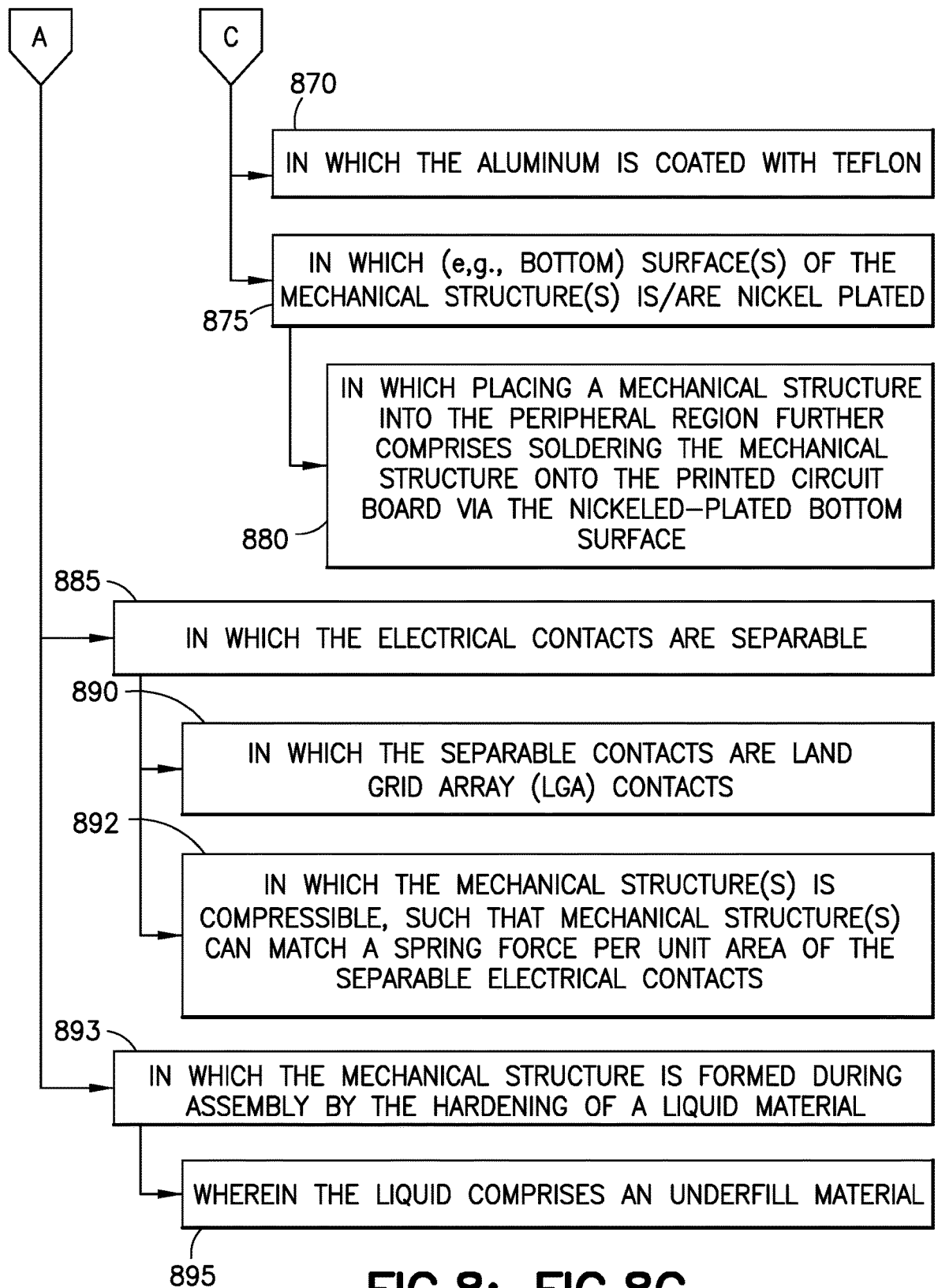
FIG.8: FIG.8C

FLEX PREVENTION MECHANICAL STRUCTURE SUCH AS A RING FOR LARGE INTEGRATED CIRCUIT MODULES AND PACKAGES AND METHODS OF MANUFACTURE USING SAME

BACKGROUND

This invention relates generally to silicon integrated circuit chips and other chips and, more specifically, relates to packaging for the same.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Silicon Integrated Circuit (IC) chips are typically packaged by mounting one or more chips or chip stacks on a laminate module, sometimes with an interposer for added wiring density. Chips, chip stacks and interposers with large numbers of electrical contacts are soldered to the module substrates using a dense array of contacts, commonly named C4 contacts.

Historically, such modules have been significantly larger in area than the chips, because the modules serve as space transformers between the small pitch of the C4 contacts and the larger pitch of the contacts that connect the module to a printed circuit board. If the module-to-board contacts are separable contacts such as Land Grid Array (LGA) contacts, then the module dimensions can be made quite large. The separable contacts allow for slippage between the module and the board during thermal expansion and contraction.

However, if the module-to-board contacts are not separable (referred to as nonseparable), such as Ball Grid Array (BGA) contacts, then there is a maximum size allowed for the array of contacts, before thermal stress causes unacceptable warping or cracking. Separable has to do with field reworkability. Separable means you do not need a big tool or do not have to apply heat to separate the two parts. Thus far, with large numbers of signals leaving the typical module to connect to external, off-module memory devices such as Dual Inline Memory Modules (DIMMs), the module area has been larger than the net sum chip area, with the module size determined by the number of off-module electrical contacts that are required. There has not yet been a need to create a module that is significantly larger than the area required for off-module electrical contacts.

In the future, however, with, e.g., optics being mounted on the module, and with compact memory devices such as High Bandwidth Memory (HBM) chip stacks on the module, the number of off-module electrical contacts will diminish in some cases. One will then encounter a class of module design, where the chips (including chip stacks and interposers) on the top surface of the module will take significantly more area than the LGA, BGA or other electrical contacts on the bottom surface of the module.

In the case of nonseparable module-board connections such as BGA, the maximal area of BGA connections may place a limit on module area that is much smaller than the desired amount of chip function that the designer wishes to include on the top surface of the module. One can't simply have a small BGA or other (LGA) contact area on the bottom surface of the module, with empty space outside the bottom surface contact area, with top surface chips above this empty under-module space. One needs to make a thermal contact to the top surface chips, and making a low thermal resistance contact requires temporary or long term pressure on the top surface of the chips. That is, the weight of the heat spreader does not provide sufficient force to make the thermal interface material mate with low thermal resistance to the structures above or below. If there is no support on the bottom surface of the module, then the module will bend, warp or crack. One needs mechanical support under the bottom surface of the module, e.g., in regions outside the module-to-board nonseparable contact region.

SUMMARY

This section is meant to be exemplary and not meant to be limiting.

An exemplary method includes attaching an integrated circuit chip module substrate to a printed circuit board (PCB). One or more first regions of a bottom surface of the module comprise electrical contacts to the board, and one or more second regions of the bottom surface of the module lack such contacts. The method includes assembling one or more mechanical structures into the second regions. These one or more mechanical structures allow lateral motion of the module relative to the board, and are sized and placed to inhibit bending of the second regions of the module towards the board under application of a vertical force on a top surface of the module.

Another example is a package for an integrated circuit. The package includes an integrated circuit chip module substrate attached to a printed circuit board (PCB). One or more first regions of a bottom surface of the module comprise electrical contacts to the board, wherein one or more second regions of the bottom surface of the module lack such contacts. The package also includes one or more mechanical structures assembled into the one or more second regions. These one or more mechanical structures allow lateral motion of the module relative to the board, and are sized and placed to inhibit bending of second regions of the module towards the board under application of a vertical force on a top surface of the module.

BRIEF DESCRIPTION OF THE SEVERAL VIEWS OF THE DRAWINGS

FIG. 6A is a view of the mechanical structural ring of FIG. 6, where the ring is formed from three parts;

FIG. 7A is a view of the mechanical structural ring of FIG. 7, where the ring is formed from three parts; and FIG. 8, spread over FIGS. 8A, 8B, and 8C, is a flowchart of a method of forming an IC package comprising a flex prevention mechanical structure such as a ring for large integrated circuit modules.

DETAILED DESCRIPTION

Figure 1:
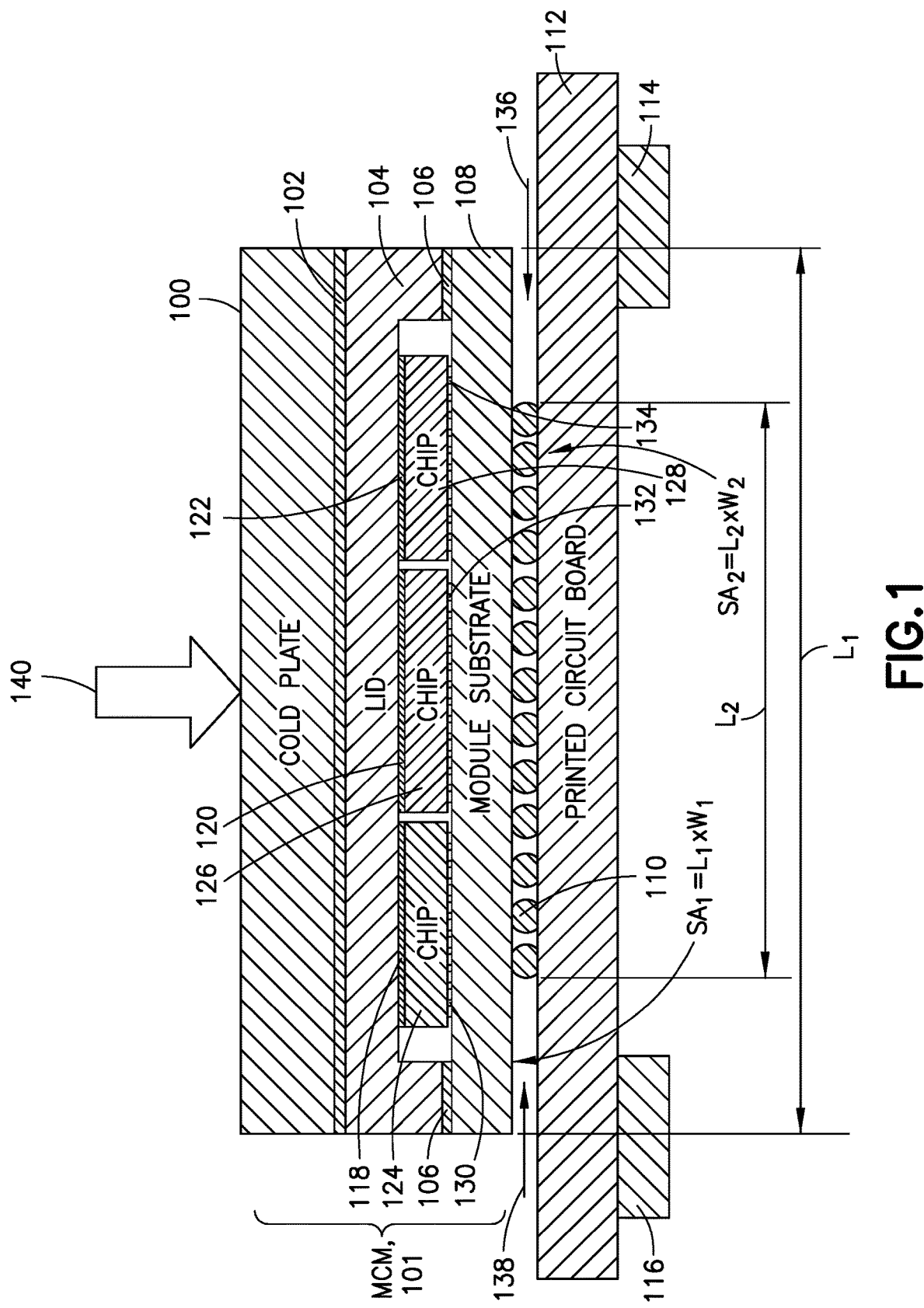
FIG. 1 is a cross-sectional view of a multi-chip module which is attached to a circuit board by Ball Grid Array (BGA) contacts.

The following abbreviations that may be found in the specification and/or the drawing figures are defined as follows:
3D three-dimensional
BGA Ball Grid Array
HBM High Bandwidth Memory
IC Integrated Circuit
LGA Land Grid Array
MCM Multi-Chip Module
PCB Printed Circuit Board The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above, in the case of nonseparable module-board connections such as BGA, the maximal area of BGA connections may place a limit on module area that is much smaller than the desired amount of chip function that the designer wishes to include on the top surface of the module. One needs to make a thermal contact to the top surface chips, and making a low thermal resistance contact requires temporary or long term pressure on the top surface of the chips. If there is no support on the bottom surface of the module, then the module will bend, warp or crack. Exemplary embodiments herein propose methods and corresponding packages to provide such mechanical support under the bottom surface of the module.

More specifically, exemplary embodiments provide mechanical support between a module and a circuit board, in regions where there are no electrical contacts between the module and board. These exemplary embodiments allow putting pressure on devices on the top surface of the module, when those devices have no module-to-board contacts directly underneath the top surface devices.

Turning to FIG. 1, this figure shows a cross-sectional view of a Multi-Chip Module (MCM) 101, which is attached to a circuit board (a PCB) 112 by Ball Grid Array (BGA) contacts 110. Multiple chips 124, 126, 128 are attached to a module substrate 108 through C4 solder bumps 130, 132, 134. The surface area, $SA_2$, of the central BGA solder contacts 110 is smaller than the bottom surface area, $SA_1$, of the substrate 108. The bottom surface area, $SA_1$, of the substrate 108 is $L_1 \times W_1$, where $L_1$ is shown as the "length" of the substrate 108 and $W_1$ is the "width" of the substrate 108, which in this view goes into the page. The surface area, $SA_2$, of the central BGA solder contacts 110 is $L_2 \times W_2$, where $L_2$ is shown as the "length" of the central BGA solder contacts 110 and $W_2$ is the "width" of the central BGA solder contacts 110, which in this view goes into the page. This surface area difference results in empty outer or peripheral regions 136, 138. When a loading force 140 is applied on top of the cold plate 100, this lack of peripheral contacts will cause deformation of the substrate and mechanical stress on the BGA solder contacts 110.

The cold plate 100 is attached to the lid 104 using thermal interface material 102. Each chip 124, 126, 128 is coupled to the lid 104 using respective thermal interface material 118, 120, 122. Additional thermal interface material 106 is used between the lid 104 and the module substrate 108. Electrical connectors 114, 116 provide electrical (e.g., and physical) coupling to a case (not shown) or other element to which the PCB 112 would be attached.

FIG. 1 therefore illustrates a problem, which is that there are empty outer or peripheral regions 136, 138, such that, when a loading force 140 is applied on top of the cold plate 100, this lack of peripheral contacts will cause deformation of the substrate and mechanical stress, e.g., on the BGA solder contacts 110. As stated above, exemplary embodiments herein provide mechanical support between a module and a circuit board, in regions where there are no electrical contacts between the module and board.

Figure 2:
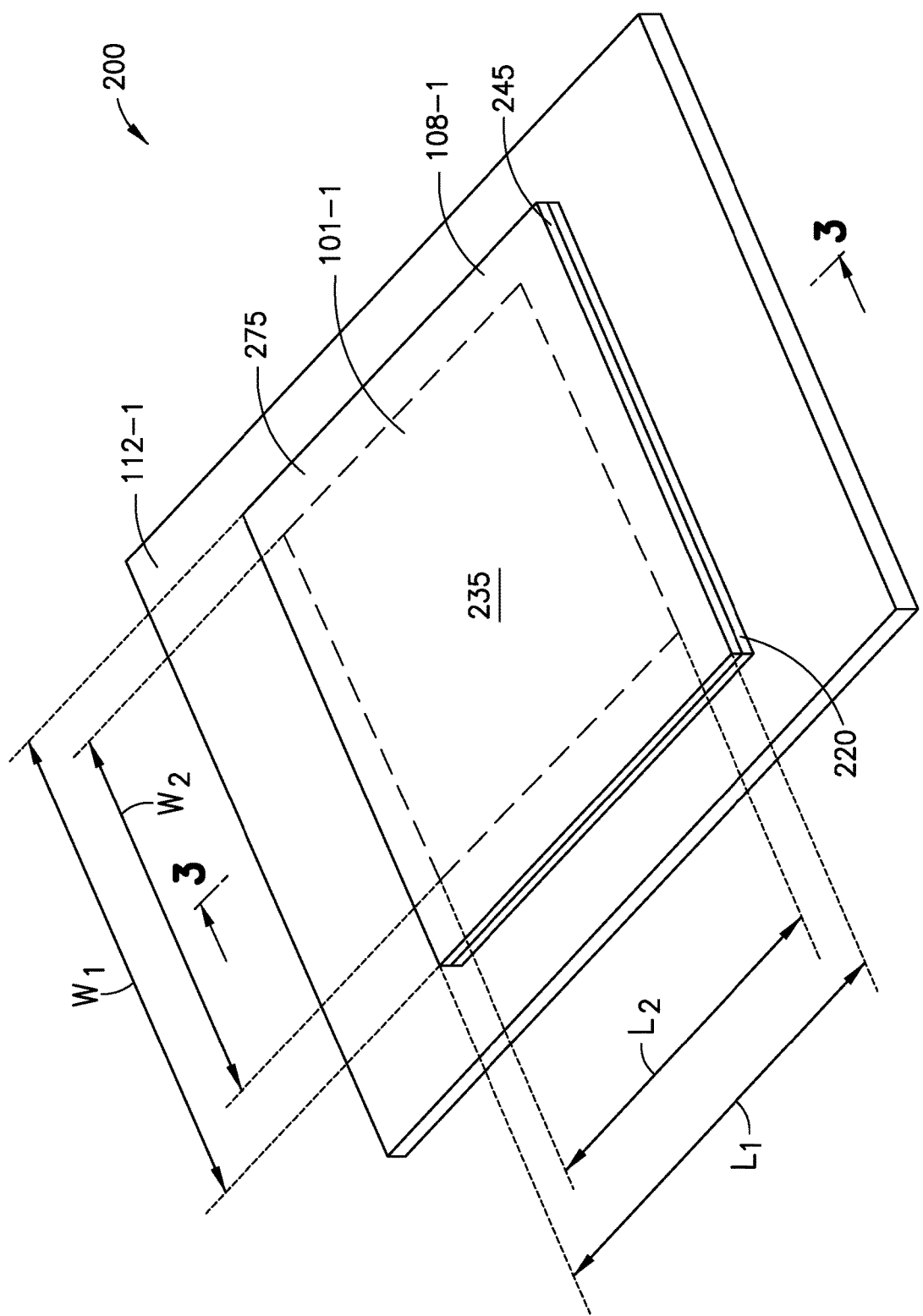
FIG. 2 is a 3D (three-dimensional) view showing an Integrated Circuit (IC) package comprising a module mounted on a PCB with mechanical structural ring between the periphery of the module and the PCB, in an exemplary embodiment.

FIG. 2 provides an illustration of this. FIG. 2 is a 3D view showing an Integrated Circuit (IC) package 200 comprising a module 101-1 mounted on a PCB 112-1 with a mechanical structural ring 220 between the periphery of the module 101-1 and the PCB 112-1. The bottom surface area, $SA_1$, of the substrate 108-1 is $L_1 \times W_1$, and the surface area, $SA_2$, of the central solder contacts area 235 is $L_2 \times W_2$. A periphery gap 275 is shown, which is a gap between a central solder contacts area 235 (the periphery of which is indicated by dashed lines) and the outer periphery 245 of the module 200-1.

Figure 3:
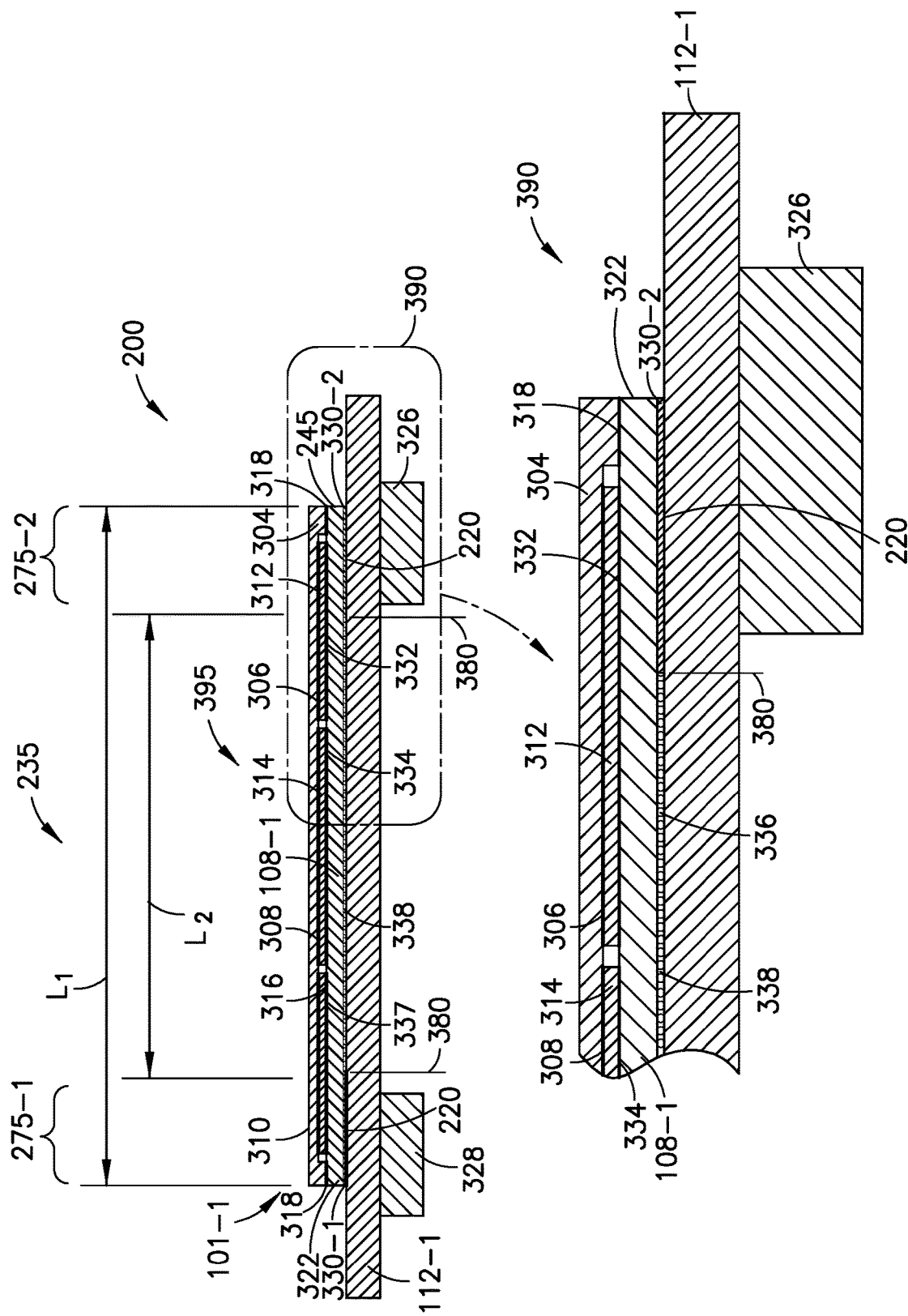
FIG. 3 is a cross-sectional view of the elements of FIG. 2, where the module is assembled onto a PCB, where the edge of the module extends past the edge of the contacts, leading to peripheral gap which is filled with mechanical structural ring, in an exemplary embodiment.

FIG. 3 is cross-sectional view of the elements of FIG. 2, where a module 101-1 is assembled onto a PCB 112-1. FIG. 3 includes a normal view 395 on top and a close up view 390 on bottom. The edges 322 of the module 101-1 extend past the edges 380 of the contacts 336, leading to a peripheral gap 275 which is filled with mechanical structural ring 220, specifically by sides 330-1, 330-2 in the corresponding peripheral gaps 275-1, 275-2. It is likely each side 330-1, 330-2 and corresponding periphery gap 275-1, 275-2 would have the same length, but this is not a requirement or limitation.

As shown in FIG. 3, a multi-chip module 101-1 is attached to a printed circuit board (PCB) 112-1 by BGA contacts 336. Multiple chips 312, 314, 316 are attached to a substrate 108-1 through C4 solder bumps 332, 334, 337. The multiple chips 312, 314, 316 also contact a copper lid 304 through thermal interface materials 306, 308, 310.

A seal bend ring 318 is used to glue the lid 304 on to the substrate 108-1 to make the multi-chip module 101-1 sealed. A mechanical structural ring 220 is applied between PCB 112-1 and the substrate 108-1 to fill the peripheral gap 275 between the central solder contacts area 235 and the outer periphery 245. The mechanical structural ring 220 can be either dry contact (not shown) or soldered/glued 332 on top of the PCB 112-1 or connected via other methods. An underfill material 338 is applied to fill the gaps between the solder (e.g., BGA) contacts 336 to protect mechanical stress on the solder contacts 336 in response to any loading force being applied on the module 101-1. Note that reference 338 may also represent the gaps between the contacts 336. Electronic connectors 326, 328 are mounted on the PCB 112-1.

Figure 4:
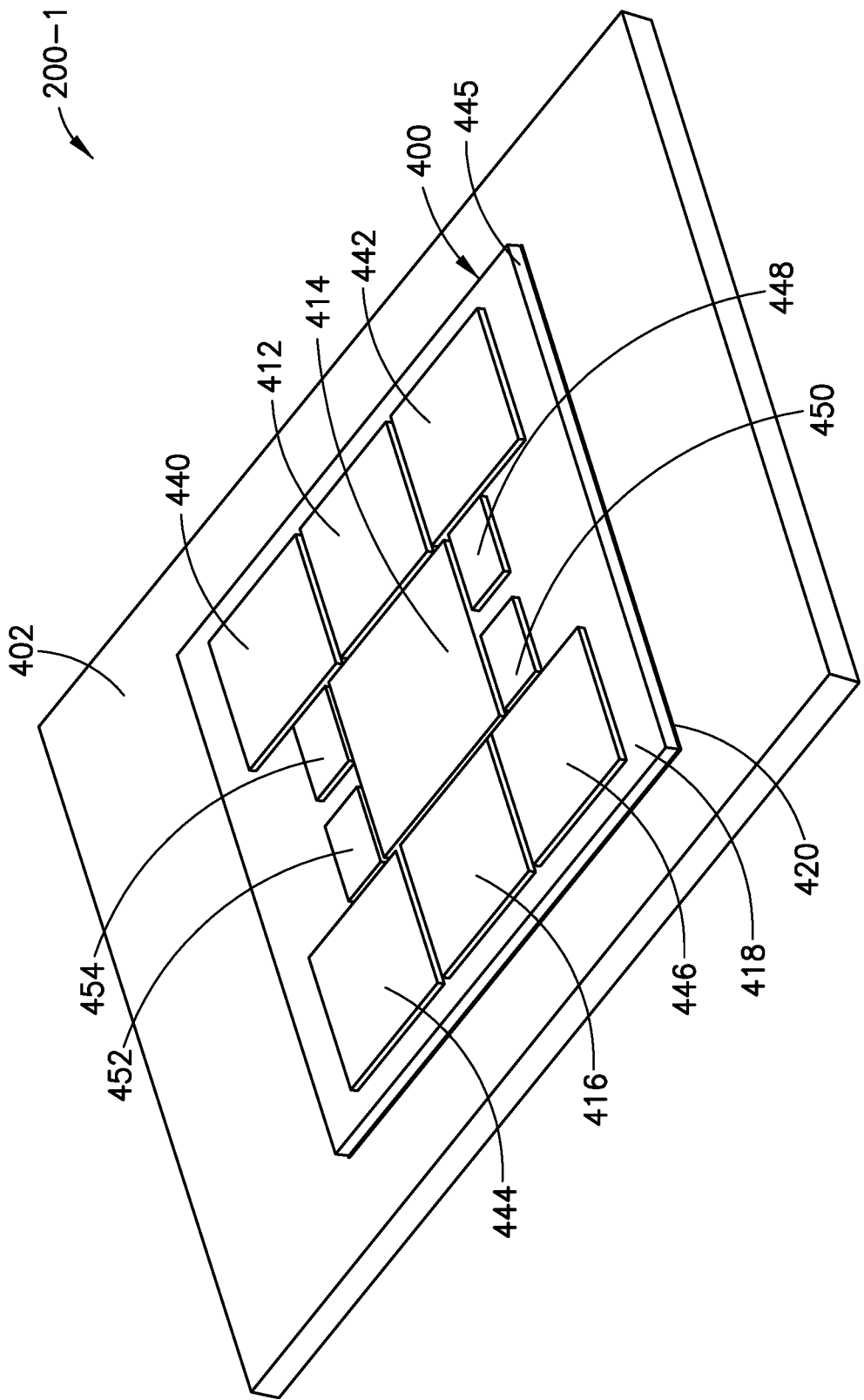
FIG. 4 is a 3D view showing an IC package comprising an open lid module mounted on a PCB, in an exemplary embodiment.

FIG. 4 is a 3D view of another exemplary embodiment showing an IC package 200-1 comprising an open lid module 400 (that is, with no lid) mounted on a PCB 402. Multiple chips 412, 414, 416, 440, 442, 444, 446, 448, 450, 452, 454 are attached to a substrate 418. The multi-chip module is mounted on a PCB 402 with mechanical ring 420 between the periphery 445 of the module 400 and the PCB 402. The mechanical ring 420 is a thin element that wraps around interior of the periphery 445 of the module 440. In this view, the mechanical ring 420 is harder to see, so FIG. 5 is used to make this clearer.

Figure 5:
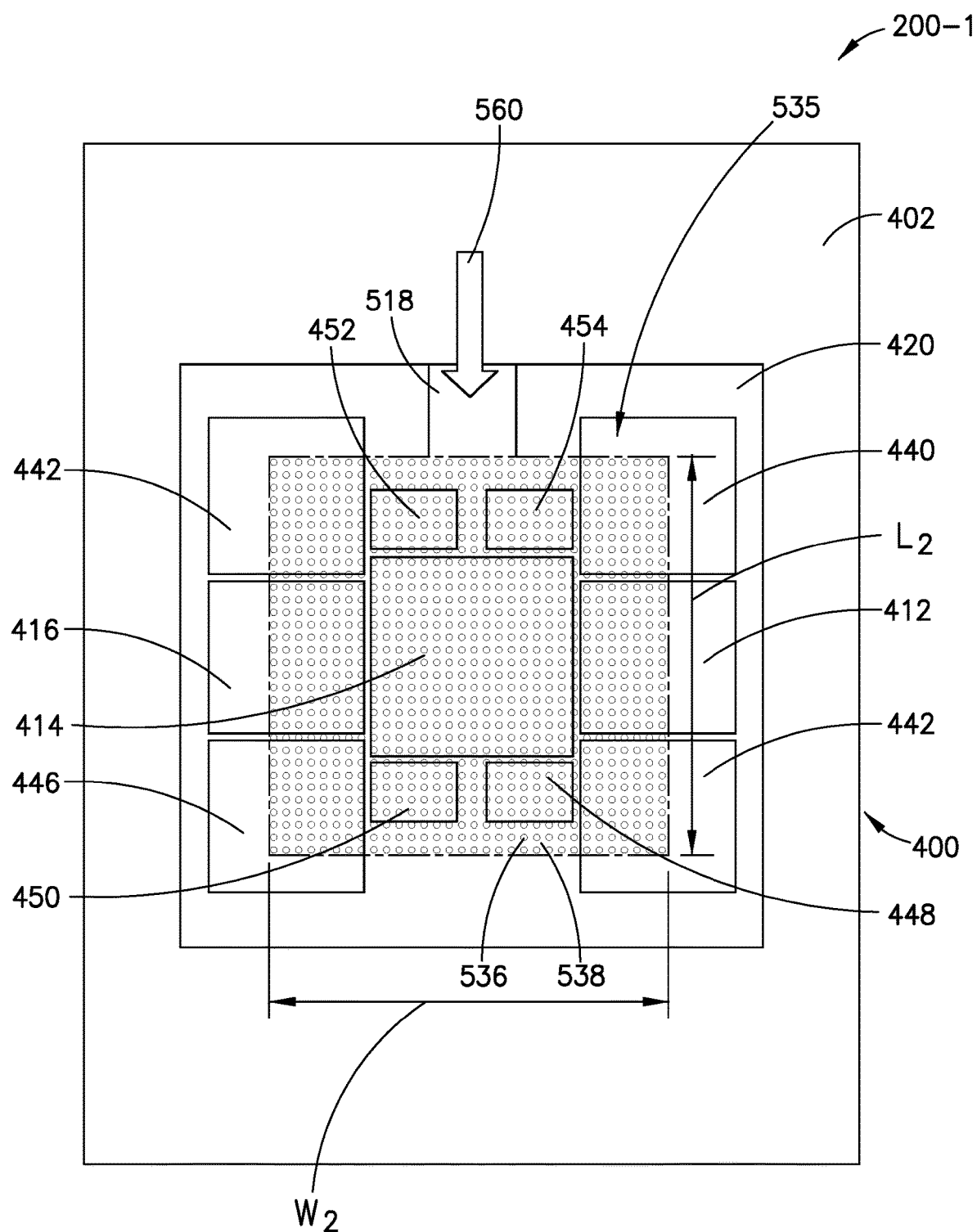
FIG. 5 is a transparent top view of the elements in FIG. 4, in an exemplary embodiment.

FIG. 5 is transparent top view of the elements in FIG. 4, where the module 400 is mounted on a PCB 402. The multi-chip module 400 is mounted on the PCB 402 through the solder contacts 536, such as BGA contacts. In this example, the substrate 418 is removed (or transparent) so that the mechanical ring 420 is more easily seen. An underfill material 560 can be inserted from the opening area 518 of the mechanical structural ring 420 to the solder contacts area 535 (the extent of which is defined by $L_2 \times W_2$) to fill the gaps 538 between the solder contacts 536.

Figure 6:
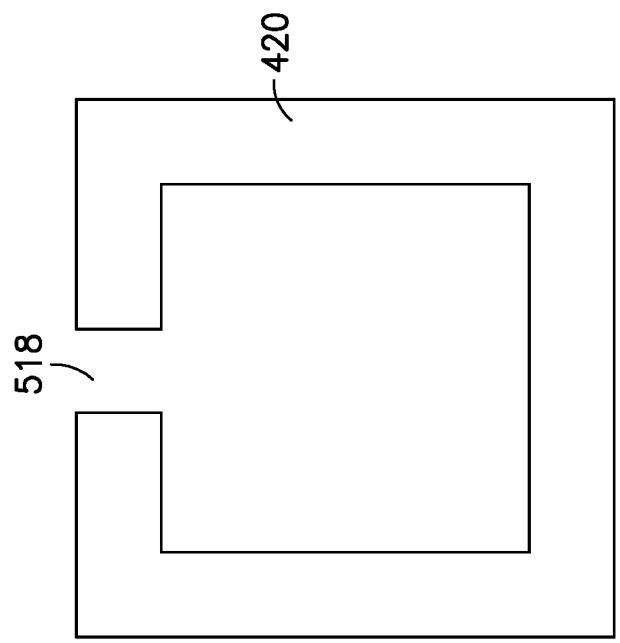
FIG. 6 is a 3D view of the mechanical structural ring from FIGS. 4 and 5, in an exemplary embodiment.
Figure 7:
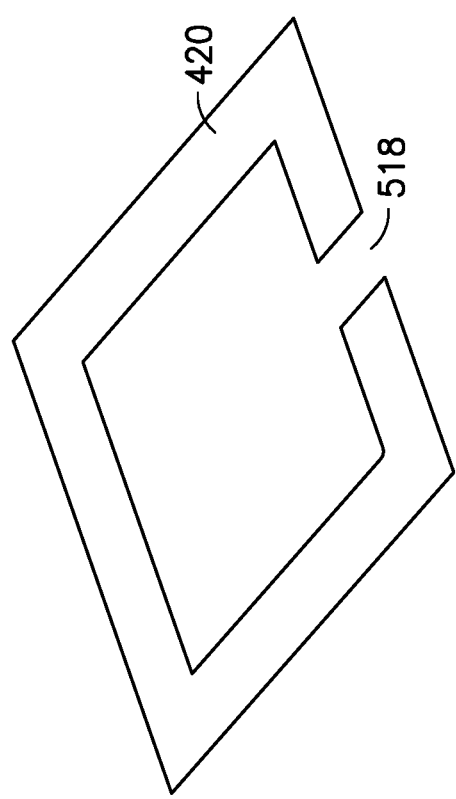
FIG. 7 is a top view of the mechanical structural ring from FIGS. 4 and 5, in an exemplary embodiment.

FIG. 6 is a 3D view of the mechanical structural ring 420 from FIGS. 4 and 5. This illustrates the opening area 518 too. FIG. 7 is top view of the mechanical structural ring 420 from FIGS. 4 and 5.

FIGS. 6A and 7A also illustrate another possibility, where the structural ring 420-1 is formed from multiple parts. That is, the ring 420 from FIGS. 6 and 7 is formed into a ring 420-1 comprised of parts 500-1, 500-2, and 500-3. The parts 500 are illustrated as being slightly separated, but could also abut each other. The parts 500 are mechanical structures that form a larger mechanical structure, in this example, ring 420-1.

Turning to FIG. 8, spread over FIGS. 8A, 8B, and 8C, this figure is a flowchart of a method of forming an IC packaged comprising a flex prevention mechanical structure such as a ring for large integrated circuit modules. This further illustrates IC package components and their construction.

An exemplary method comprises, in block 805, attaching an integrated circuit chip module substrate to a printed circuit board (PCB), wherein one or more first regions (such as a central region) of the bottom surface of the module comprises electrical contacts to the board, wherein one or more second regions (such as a peripheral region) of the bottom surface of the module lacks such contacts. In block 810, the method includes assembling one or more mechanical structures into the peripheral region, wherein these one or more mechanical structures allow lateral motion of the module relative to the board, and wherein these mechanical structures are sized and placed to inhibit bending of the second regions (e.g., periphery) of the module towards the board under application of a vertical force on a top surface of the module. The lateral motion of the structure is desirable, as the materials above and below may have different coefficients of thermal expansion. The assembling the mechanical structure(s) into the peripheral region is performed to allow the lateral motion. See, e.g., blocks 835, 840, and 845.

As indicated by block 813, the central electrical contacts may be nonseparable. The nonseparable electrical contacts may be ball grid array (BGA) solder contacts, as indicated by block 815.

In block 820, at least one of the one or more mechanical structures comprises a ring whose thickness lies between pre-assembly and post-assembly thicknesses of the electrical contacts. This block assumes a single mechanical structure comprising a ring, but it is possible there could be, e.g., multiple concentric rings or a ring and other structures. It is noted that it is known how to determine the pre-assembly and post-assembly thicknesses of the electrical contacts. The mechanical structure, such as a ring, may be preformed, meaning the shape of the ring is formed in a different process prior to the assembly process. Alternatively or in addition, some or all the mechanical structure(s) may be formed in place during assembly. In block 825, the method can include either block 815 or block 820, in which the mechanical structure thickness is between pre-reflow and post-reflow BGA solder ball heights.

In block 835, at least one of the one or more mechanical structures assembled in the outer peripheral region is firmly affixed to neither the module substrate nor the PCB. Put differently, at least one of the one or more mechanical structures assembled in the outer peripheral region is not firmly affixed to either the module substrate or the PCB. In another example, in block 840, at least one of the one or more mechanical structures assembled in the outer peripheral region is firmly affixed to the module substrate but not to the PCB. Alternatively, in block 845, at least one of the one or more mechanical structures assembled in the outer peripheral region is firmly affixed to the PCB but not to the module substrate. For this example, the mechanical structure(s) is affixed to the PCB with glue in block 850, or the mechanical structure(s) is affixed to the PCB with solder in block 855. Other attachment techniques may also be used.

In block 860, which may be based on the method of blocks 805/810 or also block 820, the mechanical structure(s) (e.g., ring) has one or more openings, and the method further comprises injecting a liquid underfill material through the one or more openings and flowing the liquid into the central region and between the module and the printed circuit board.

In block 865, which may be based on the method of blocks 805/810 or also block 820, the mechanical structure is made of aluminum. As a further example, in block 870, the aluminum is coated with Teflon. Teflon is a brand name by Dupont, Inc., of polytetrafluoroethylene. The coating could be applied to the top, bottom or both. Furthermore, all outer surfaces may be coated with Teflon. Alternatively, (e.g., the bottom surface of) the mechanical structure is nickel plated in block 875. This plating also could be applied to all outer surfaces, or possibly to selected surfaces. For this example, in block 880, the placing a mechanical structure into the peripheral region further comprises soldering the mechanical structure onto the printed circuit board via the nickeled-plated bottom surface. The bottom surface is the surface nearest or attached to the PCB. The top surface could similarly be used instead of the bottom surface.

In block 885, which depends from the method of blocks 805/810, the electrical contacts are separable. The separable contacts are Land Grid Array (LGA) contacts in block 890. In block 892, the mechanical structure(s) is compressible, such that mechanical structure(s) can match a spring force per unit area of the separable electrical contacts.

In block 893, which depends from the method of blocks 805/810, the mechanical structure is formed during assembly by hardening of a liquid material. In block 895, the liquid comprises an underfill material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A package for an integrated circuit, comprising:
an integrated circuit chip module substrate attached to a printed circuit board (PCB), wherein one or more first regions of a bottom surface of the module comprise electrical contacts to the printed circuit board in a central contacts area, wherein one or more second regions of the bottom surface of the module and outside the central contacts area lack such contacts; and
one or more mechanical structures assembled into the one or more second regions, wherein these one or more mechanical structures allow lateral motion of the module relative to the printed circuit board and comprise a ring whose thickness lies between pre-assembly and post-assembly thicknesses of the electrical contacts, wherein the one or more second regions form a gap around a periphery of the integrated circuit chip module at least from edges of the central contacts area to corresponding edges of the integrated circuit chip module substrate and between the bottom surface of the module and a top surface of the printed circuit board, and wherein the ring fills the gap from the edges of the central contacts region to the corresponding edges of the integrated circuit chip module substrate, in which the gap has multiple sides along the periphery, the ring is one contiguous piece for three of the multiple sides and has an opening along a fourth of the multiple sides, and an underfill material at least partly fills the one or more openings and fills at least one of the one or more first regions between the module and the printed circuit board.

2. The package of claim 1, in which the electrical contacts in at least one of the one or more first regions are nonseparable, and in which the nonseparable electrical contacts are ball grid array (BGA) solder ball contacts.

3. The package of claim 2, in which mechanical structure thickness of the one or more mechanical structures is between pre-reflow and post-reflow BGA solder ball heights.

4. The package of claim 1, wherein at least one of the one or more mechanical structures assembled in the one or more second regions is not affixed to either the module substrate or the PCB.

5. The package of claim 1, wherein at least one of the one or more mechanical structures assembled in the one or more second regions is firmly affixed to the module substrate but not to the PCB.

6. The package of claim 1, wherein at least one of the one or more mechanical structures assembled in the one or more second regions is firmly affixed to the PCB but not to the module substrate.

7. The package of claim 6, wherein the at least one mechanical structure is affixed to the PCB with solder.

8. The package of claim 1, in which at least one of the one or more mechanical structures, including the ring, is made of aluminum.

9. The package of claim 8, in which the aluminum is coated with polytetrafluoroethylene.

10. The package of claim 8, in which a bottom surface of the at least one of the one or more mechanical structures is nickel plated.

11. The package of claim 10, in which the at least one mechanical structure assembled into the one or more second regions is attached to the printed circuit board via the nickel-plated bottom surface.

12. The package of claim 1, in which the electrical contacts are separable.

13. The package of claim 12, in which the separable contacts are Land Grid Array (LGA) contacts.

14. The package of claim 1, in which at least one of the one or more mechanical structures comprises an underfill material.

15. A package for an integrated circuit, comprising:
an integrated circuit chip module substrate attached to a printed circuit board (PCB), wherein one or more first regions of a bottom surface of the module comprise electrical contacts to the printed circuit board in a central contacts area, wherein one or more second regions of the bottom surface of the module and outside the central contacts area lack such contacts; and
one or more mechanical structures assembled into the one or more second regions, wherein these one or more mechanical structures allow lateral motion of the module relative to the printed circuit board and comprise a ring whose thickness lies between pre-assembly and post-assembly thicknesses of the electrical contacts, wherein the one or more second regions form a gap around a periphery of the integrated circuit chip module at least from edges of the central contacts area to corresponding edges of the integrated circuit chip module substrate and between the bottom surface of the module and a top surface of the printed circuit board, and wherein the ring fills the gap from the edges of the central contacts region to the corresponding edges of the integrated circuit chip module substrate, in which the gap has multiple sides along the periphery, in which the ring has multiple parts filling the gap in three of the multiple sides and at least two of the parts form one or more openings along a fourth of the multiple sides, in which the parts not forming the one or more openings are slightly separated or abut each other, and in which an underfill material at least partly fills the one or more openings and fills at least one of the one or more first regions between the module and the printed circuit board.

16. A package for an integrated circuit, comprising:
an integrated circuit chip module substrate attached to a printed circuit board (PCB), wherein one or more first regions of a bottom surface of the module comprise electrical contacts to the printed circuit board in a central contacts area, wherein one or more second regions of the bottom surface of the module and outside the central contacts area lack such contacts; and
one or more mechanical structures assembled into the one or more second regions, wherein these one or more mechanical structures allow lateral motion of the module relative to the printed circuit board and comprise a ring whose thickness lies between pre-assembly and post-assembly thicknesses of the electrical contacts, wherein the one or more second regions form a gap around a periphery of the integrated circuit chip module at least from edges of the central contacts area to corresponding edges of the integrated circuit chip module substrate and between the bottom surface of the module and a top surface of the printed circuit board, and wherein the ring fills the gap from the edges of the central contacts region to the corresponding edges of the integrated circuit chip module substrate, in which there are four sides containing the gap and corresponding edges of the central contacts area and the integrated circuit chip module substrate, and in which the ring fills the gap along the entire periphery of the integrated circuit chip module for at least three of the four sides and along part of the periphery of the fourth side, and in which the ring is one contiguous piece and has an opening along the fourth side, and an underfill material at least partly fills the one or more openings and fills at least one of the one or more first regions between the module and the printed circuit board.

17. A package for an integrated circuit, comprising:

an integrated circuit chip module substrate attached to a printed circuit board (PCB), wherein one or more first regions of a bottom surface of the module comprise electrical contacts to the printed circuit board in a central contacts area, wherein one or more second regions of the bottom surface of the module and outside the central contacts area lack such contacts; and one or more mechanical structures assembled into the one or more second regions, wherein these one or more mechanical structures allow lateral motion of the module relative to the printed circuit board and comprise a ring whose thickness lies between pre-assembly and post-assembly thicknesses of the electrical contacts, wherein the one or more second regions form a gap around a periphery of the integrated circuit chip module at least from edges of the central contacts area to corresponding edges of the integrated circuit chip module substrate and between the bottom surface of the module and a top surface of the printed circuit board, and wherein the ring fills the gap from the edges of the central contacts region to the corresponding edges of the integrated circuit chip module substrate, in which there are four sides containing the gap and corresponding edges of the central contacts area and the integrated circuit chip module substrate, and in which the ring fills the gap along the entire periphery of the integrated circuit chip module for at least three of the four sides and along part of the periphery of the fourth side, and in which the ring has multiple parts and at least two of the parts form one or more openings along the fourth side, in which the parts not forming the one or more openings are slightly separated or abut each other, and in which an underfill material at least partly fills the one or more openings and fills at least one of the one or more first regions between the module and the printed circuit board.

* * * * *